United States Patent
Wang et al.

(10) Patent No.: US 10,212,841 B1
(45) Date of Patent: Feb. 19, 2019

(54) CABINET HOLDING STRUCTURES FOR SERVER

(71) Applicant: Super Micro Computer Inc., San Jose, CA (US)

(72) Inventors: Kuo-Hsien Wang, San Jose, CA (US); Ken-Sheng Lin, San Jose, CA (US); Richard S. Chen, San Jose, CA (US)

(73) Assignee: SUPER MICRO COMPUTER INC., San Jose, CA (US)

( * ) Notice: Subject to any disclaimer, the term of this patent is extended or adjusted under 35 U.S.C. 154(b) by 0 days.

(21) Appl. No.: 15/828,406

(22) Filed: Nov. 30, 2017

(51) Int. Cl.
  *H05K 7/14* (2006.01)
  *A47B 88/43* (2017.01)
  *A47B 96/06* (2006.01)

(52) U.S. Cl.
  CPC .......... *H05K 7/1489* (2013.01); *A47B 88/43* (2017.01); *A47B 96/067* (2013.01)

(58) Field of Classification Search
  CPC ...... H05K 7/183; H05K 7/1488; A47B 88/43; A47B 88/423; A47B 88/40
  USPC ............ 312/330.1, 333, 334.4, 334.5, 223.1, 312/223.2; 211/26; 248/220.21, 222.14
  See application file for complete search history.

(56) References Cited

U.S. PATENT DOCUMENTS

| | | | | |
|---|---|---|---|---|
| 6,209,979 B1* | 4/2001 | Fall | ...................... | H05K 7/1489 312/319.1 |
| 7,604,307 B2* | 10/2009 | Greenwald | ............ | A47B 88/49 312/333 |
| 7,929,279 B2* | 4/2011 | Liu | ........................ | G06F 1/181 211/184 |
| 8,622,492 B2* | 1/2014 | Chen | ...................... | F16B 21/09 312/333 |
| 2002/0043914 A1* | 4/2002 | Munday | ............... | A47B 88/487 312/334.7 |
| 2007/0018547 A1* | 1/2007 | Yang | .................... | H05K 7/1489 312/333 |
| 2007/0114895 A1* | 5/2007 | Chen | .................... | H05K 7/1489 312/333 |
| 2008/0012456 A1* | 1/2008 | Judge | ................... | H05K 7/1489 312/334.1 |
| 2012/0281373 A1* | 11/2012 | Bohannon | ............ | H05K 7/1489 361/756 |

* cited by examiner

*Primary Examiner* — James O Hansen
(74) *Attorney, Agent, or Firm* — Chun-Ming Shih; HDLS IPR Services

(57) ABSTRACT

A cabinet holding structure, the slide rails are disposed on the frames and have troughs. Supporting components are assembled on ends of the slide rails. Each supporting component includes a positioning plate, a screw nut, a supporting plate, a stud and a screw bolt. The positioning plate has a through hole and is placed on the slide rail, and the supporting plate is plated on another side of the slide rail. The stud protrudes through the trough. The screw bolt passes through the trough and the through hole to be fixed by the screw nut. The chassis includes a shell and notches. The shell is positioned on the slide rails by buckling the notches and the stud together.

11 Claims, 10 Drawing Sheets

CABINET HOLDING STRUCTURES FOR SERVER

BACKGROUND OF THE INVENTION

Field of the Invention

The present invention generally relates to servers and, in particular to cabinet holding structures for servers.

Description of Prior Art

In order to meet needs of accessing large numbers of electronic data, nowadays server devices usually provide multiple chassis stacked in the cabinet, and each chassis has accommodated with a motherboard, power supply modules and arrays of hard disks.

Because the server device has a considerable weight when multiple hard disks are loaded in the cabinet; therefore, slide rails are provided for the connections between chassis and inner walls of the cabinet for facilitating the movement of chassis and the remove of hard disks. Moreover, current structures of slide rails mostly comprise an outer slide rail, a first sliding bushing, a middle slide rail, a second sliding bushing and an inner slide which are configured as a three-stage slide rail. Although the support strength of that three-stage rail is good, its overall configuration occupies more space inside the chassis which results in fewer layers of chassis stacked in the cabinet.

On the other hand, due to the support strength will be lowered when the designs of the rail structures are simplified, the overall cabinet sways because of insufficient support strength of slide rails; thus, that the probability of damages of hard drives will be increased.

In view of the above drawbacks, the Inventor proposes the present invention based on his expert knowledge and elaborate researches in order to solve the problems of prior art.

SUMMARY OF THE INVENTION

Accordingly, an object of the present invention is to provide cabinet holding structures for server to make the chassis positioned by the supporting components and stably combined in the cabinet without moving so as to reduce the chance of damages of hard disks.

In order to achieve the object mentioned above, the present invention provides cabinet holding structures for server comprises a cabinet, a pair of slide rails, a pair of supporting components, and a chassis. The cabinet has an accommodating space, and a plurality of frames are provided in the accommodating space and disposed at interval. The pair of supporting components is configured on the frames correspondingly, and each slide rail has a first side facing the other slide rail and a second side being opposite to the first side, and each slide rail has a trough at an end thereof. The pair of supporting components is disposed corresponding to the pair of slide rails and assembled on ends of the pair of slide rails separately. Each of the supporting components comprises a positioning plate, a screw nut, a supporting plate, a stud and a screw bolt disposed on the supporting plate. The positioning plate has a through hole and is placed on the first side of the slide rail, and the supporting plate is plated on the second slide of the slide rail; the stud passes through the trough from the second side of the slide rail and protrudes the first side. The screw bolt passes through the trough and through hole to be fixed by the screw nut. The chassis includes a shell and a pair of notches located on an end of the shell, and the end of the shell is positioned between the pair of the slide rails through the pair of the notches and the stud buckled together.

Compared to the prior art, the cabinet holding structures for server of the present invention, the chassis has notches at an end of the chassis, and a through is disposed at an end of the slide rail. Besides, the support components with a stud are assembled on the slide rails and their locations in the trough and that can be adjusted per the position of the chassis so as to facilitate the end of the shell positioned on the slide rail through the notches and the stud buckled together. Therefore, the chassis will be supported by the deposition of the supporting components so as to be stably combined in the cabinet without moving; thus, the chance of damages of hard disks will be reduced.

BRIEF DESCRIPTION OF DRAWING

The features of the invention believed to be novel are set forth with particularity in the appended claims. The invention itself, however, may be best understood by reference to the following detailed description of the invention, which describes a number of exemplary embodiments of the invention, taken in conjunction with the accompanying drawings, in which:

DETAILED DESCRIPTION OF THE PREFERRED EMBODIMENTS

In cooperation with attached drawings, the technical contents and detailed description of the invention are described thereinafter according to a number of preferable embodiments, being not used to limit its executing scope. Any equivalent variation and modification made according to appended claims is all covered by the claims claimed by the present invention.

Figure 1:
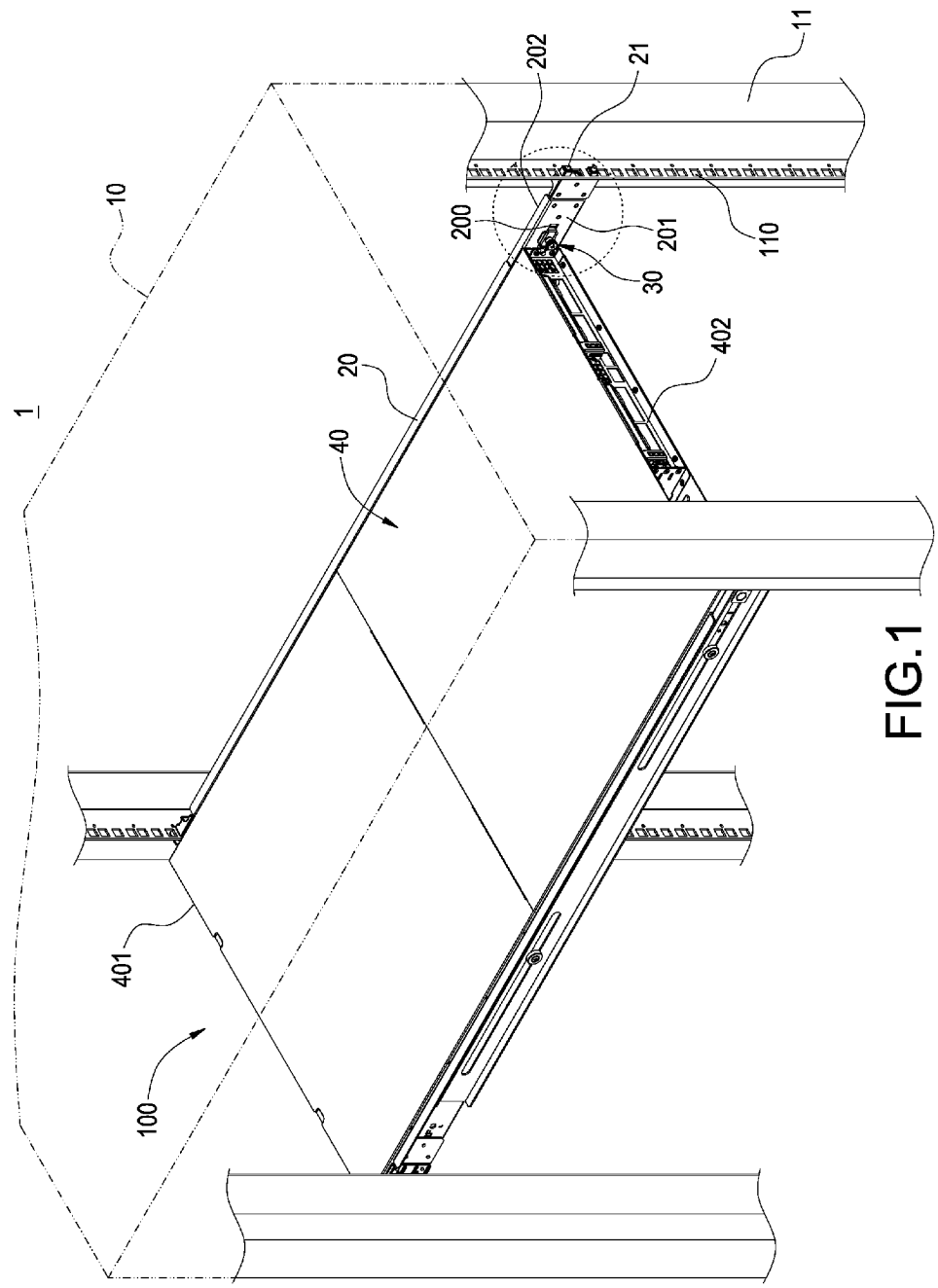
FIG. 1 is a perspective schematic view of the cabinet holding structures for server of the present invention.
Figure 3:
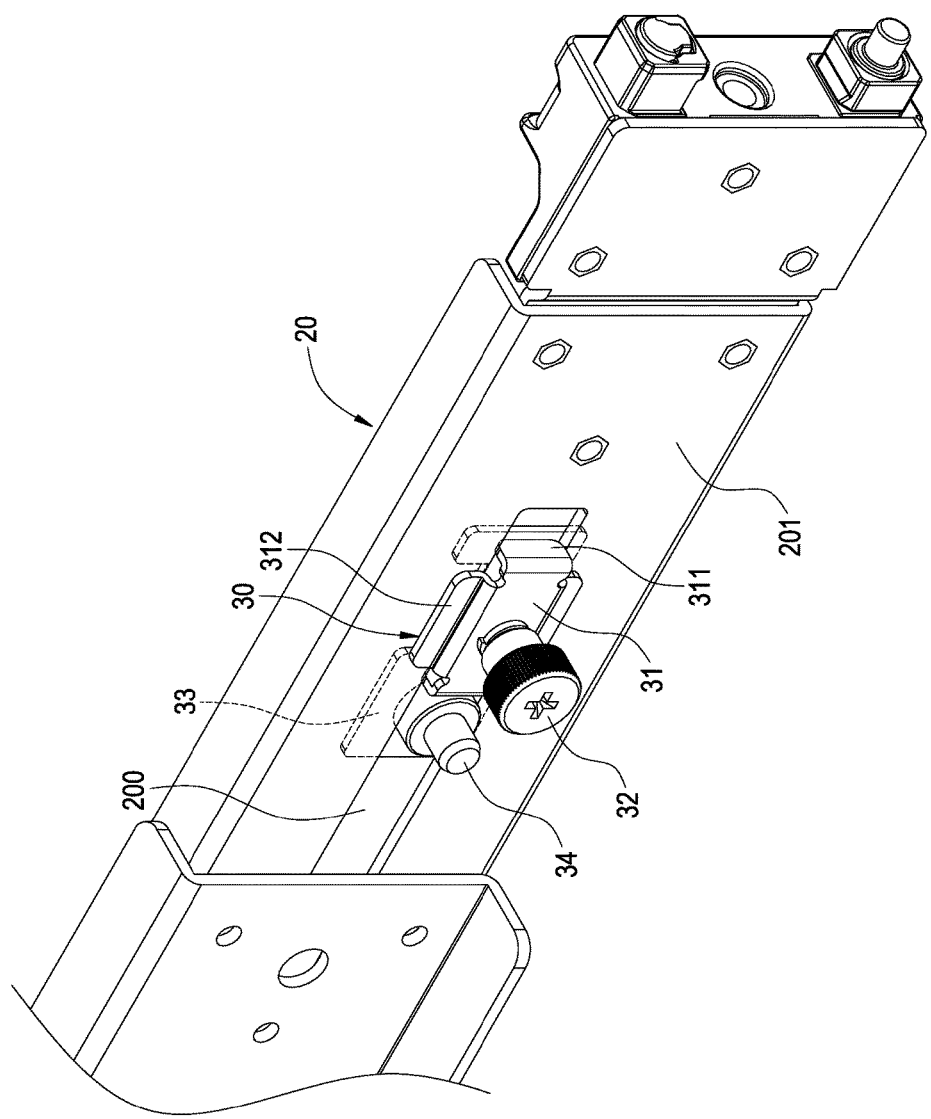
FIG. 3 is an assembly schematic view of the slide rail and supporting components of the present invention.

Please refer to FIG. 1 and FIG. 3, which depict a perspective schematic view of the cabinet holding structures for server of the present invention and a schematic view of the assembly of the chassis and slide rails of the present invention. The cabinet holding structures 1 for server includes a cabinet 10, a pair of slide rails 20, a pair of supporting components 30 and a chassis 40. The pair of slide rails 20 is disposed in the cabinet 10. The pair of supporting components 30 is combined with the pair of slide rails 20. The chassis 40 are positioned between the pair of slide rails 20 through the pair of supporting components 30. Thereby, the chassis 40 will be stably combined in the cabinet 10 by the support of the cabinet 10. More detailed descriptions of the cabinet holding structure 1 are as follows.

As shown in FIG. 1, the cabinet 10 has an accommodating space 100, and a plurality of frames 11 are provided in the accommodating space 100 and disposed at interval. The pair of slide rails 20 is configured on the frames 11 correspondingly. Each slide rail 20 has a first side 201 facing the other slide rail 20 and a second side 202 is opposite to the first side 201, and each slide rail 20 has a trough 200 at an end thereof.

It is worth noticing that, the chassis 40 has provided with a front end 401 and a rear end 402 oppositely. The front end 401 of the chassis 40 is fixed on the frames 11 by a panel structure (not shown). On the other hand, the rear end 402 of the chassis 40 is fixed on the frames 11 by the disposition of the supporting components 30 and stably combined in the cabinet 10 through the support of the cabinet 10. In the present embodiment, the frames 11 are provided with a plurality of positioning holes 110 separately, and a plurality of positioning blocks 21 are disposed at an end of each slide rail 20. The pair of slide rails 20 is combined with the frames 11 through the positioning blocks 21 inserted in the positioning holes 110.

Figure 2:
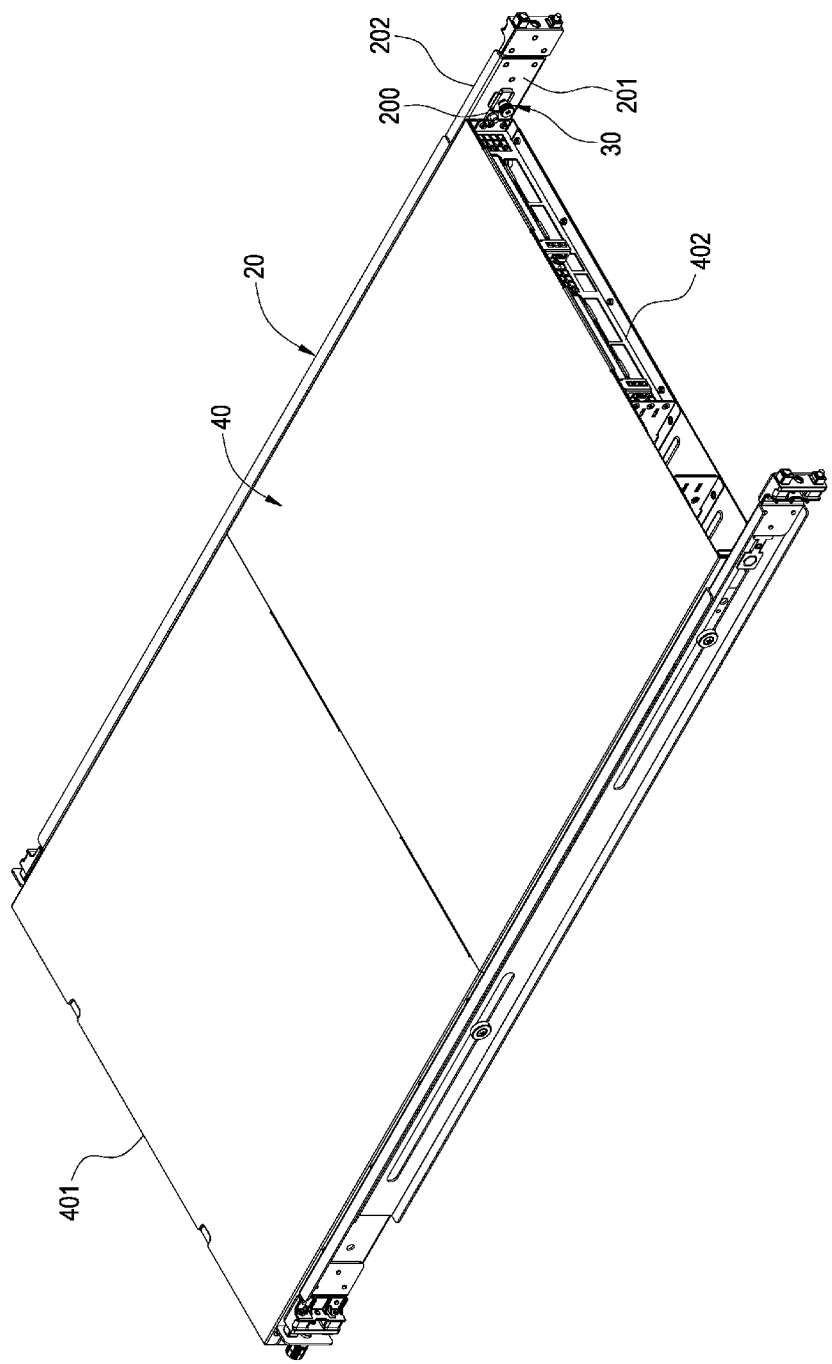
FIG. 2 is an assembly schematic view of the chassis and slide rail of the present invention.

Please refer to FIG. 2, the pair of supporting components 30 are disposed corresponding to the pair of slide rails 20 and assembled on ends of the pair of slide rails 20 separately and located near the rear end 402 of the chassis 40 so that the chassis 40 is positioned between the pair of slide rails 20 through the pair of supporting components 30.

Figure 4:
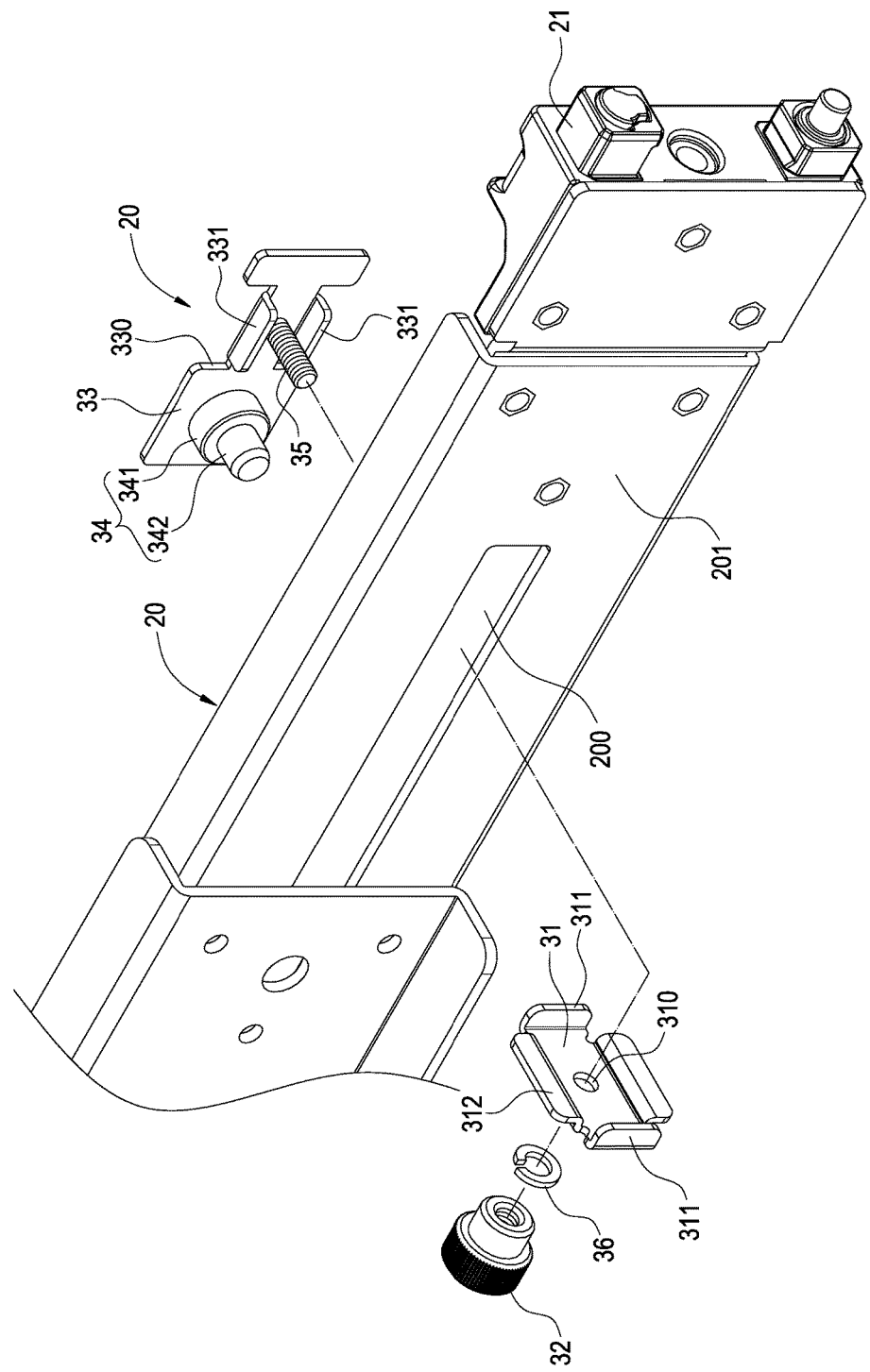
FIG. 4 is a perspective explosion schematic view of the slide rails and the supporting components of the present invention.
Figure 5:
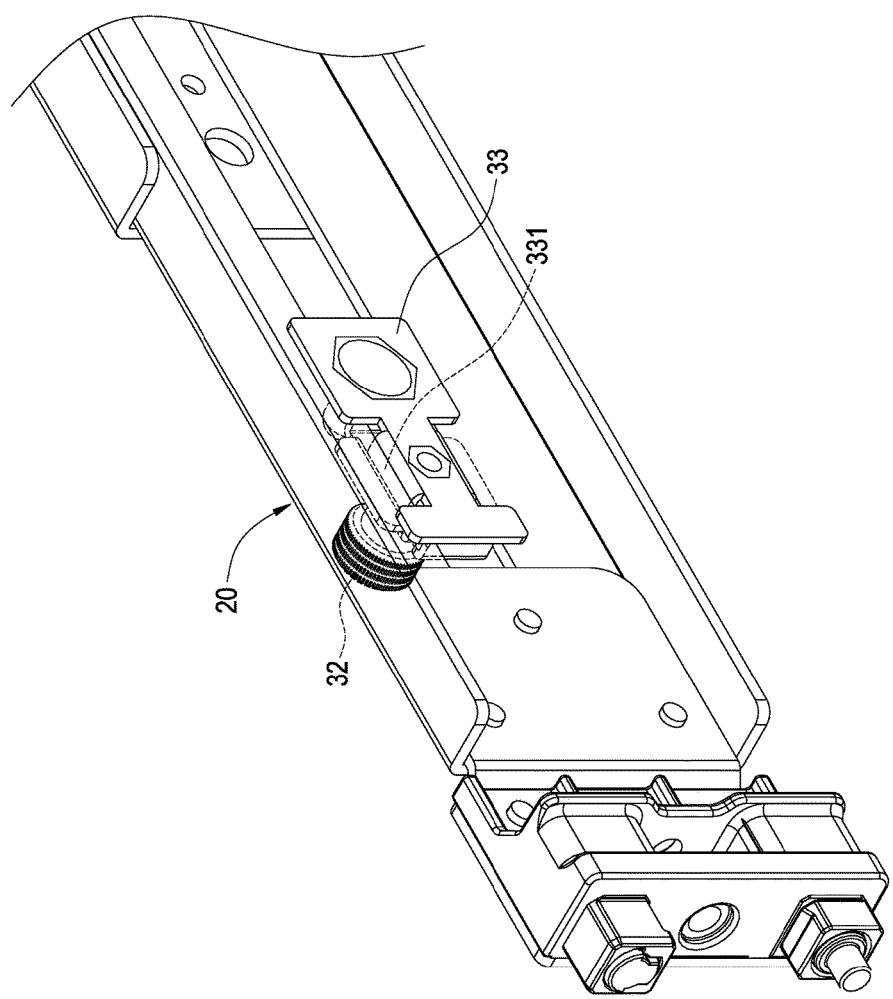
FIG. 5 is another schematic view of the slide rails and the supporting components of the present invention.

Please refer to FIG. 3 to FIG. 7, which depict a schematic view of the assembly of the slide rails and the supporting components of the present invention, a perspective explosion schematic view of the slide rails and the supporting components of the present invention, another schematic view of the assembly of the slide rails and the supporting components of the present invention, and two cross sectional views of the assembly of the slide rails and the supporting components of the present invention. As shown in FIG. 3 to FIG. 5, in one embodiment of the present invention, each of the supporting components 30 comprises a positioning plate 31, a screw nut 32, a supporting plate 33, a stud 34 and a screw bolt 35 disposed on the supporting plate 33. The positioning plate 31 has a through hole 310 and is placed on the first side 201 of the slide rail 20. Besides, the supporting plate 33 is plated on the second slide 202 of the slide rail 20.

In the present embodiment, preferably, each supporting component 30 further includes an elastic washer 36. The elastic washer 36 is clamped between the screw nut 32 and the positioning plate 31 to provide a better locking force therebetween.

Specifically, two opposite sides of the positioning plate 31 are bent and extended with a pair of longitudinal constraint walls 311, and the pair of longitudinal constraint walls 311 is inserted in the trough 200 of the slide rail 20. Preferably, a height of the pair of the longitudinal constraint walls 311 is equal to a width of the trough 200; therefore, two sides of the positioning plate 31 abut against an inner wall of trough 200 so that the positioning plate 31 will be positioned in the trough 200 without rotating or moving. Furthermore, the other two opposite sides of the positioning plate 31 are bent and extended with a pair of wings 312. The pair of wings 312 are located at two sides of the trough 200 and contacted with the second side 202 of the slide rail 20 so that the positioning plate 31 can be stably contacted with the first side 201.

Similarly, two opposite sides of the supporting plate 33 have a pair of slots 330 and a pair of horizontal constraint walls 331 located in the pair of slots 330. The pair of horizontal constraint walls 331 is inserted in the trough 200 of the slide rail 20. Preferably, a distance between the pair of horizontal constraint walls 331 is equal to a width of the trough 200. Thereby, one side of the supporting plate 33 will abut against the inner wall of the trough 200 so that a side of the support plate 33 is positioned in the trough 200 without rotating or moving.

Moreover, the stud 34 at another side of the supporting plate 33 comprises a round seat 341 riveted on the supporting plate 33 and a short column 342 extended from the round seat 341. In addition, a diameter of the round seat 341 is equal to a width of the trough 200 and pierced in the trough 200. Thereby, another side of the supporting plate 33 will abut against the inner wall of trough 200 without rotating and moving.

Figure 6:
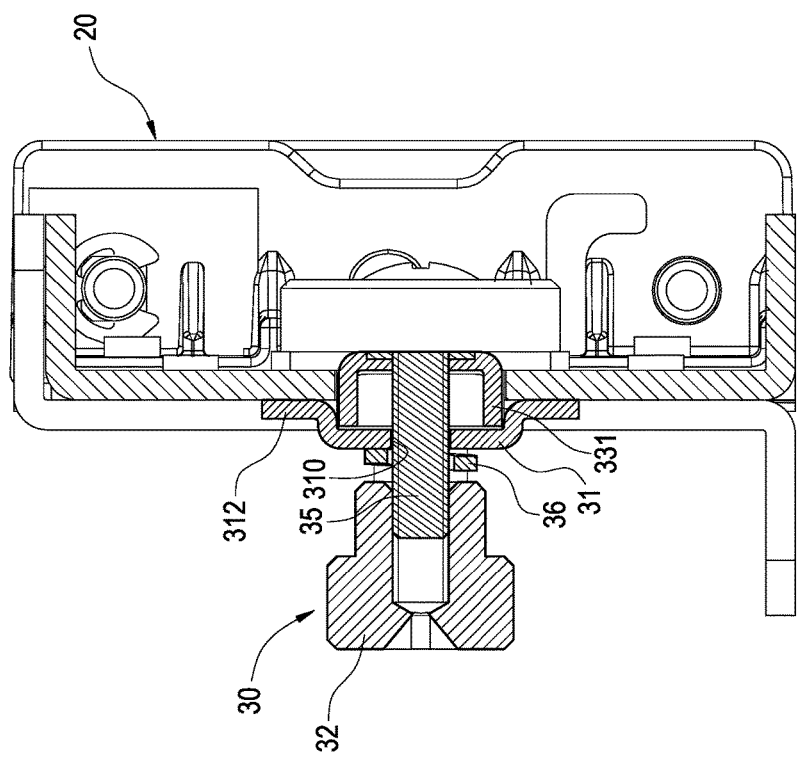
FIG. 6 is a cross sectional view of the assembly of the slide rails and the supporting components of the present invention.
Figure 7:
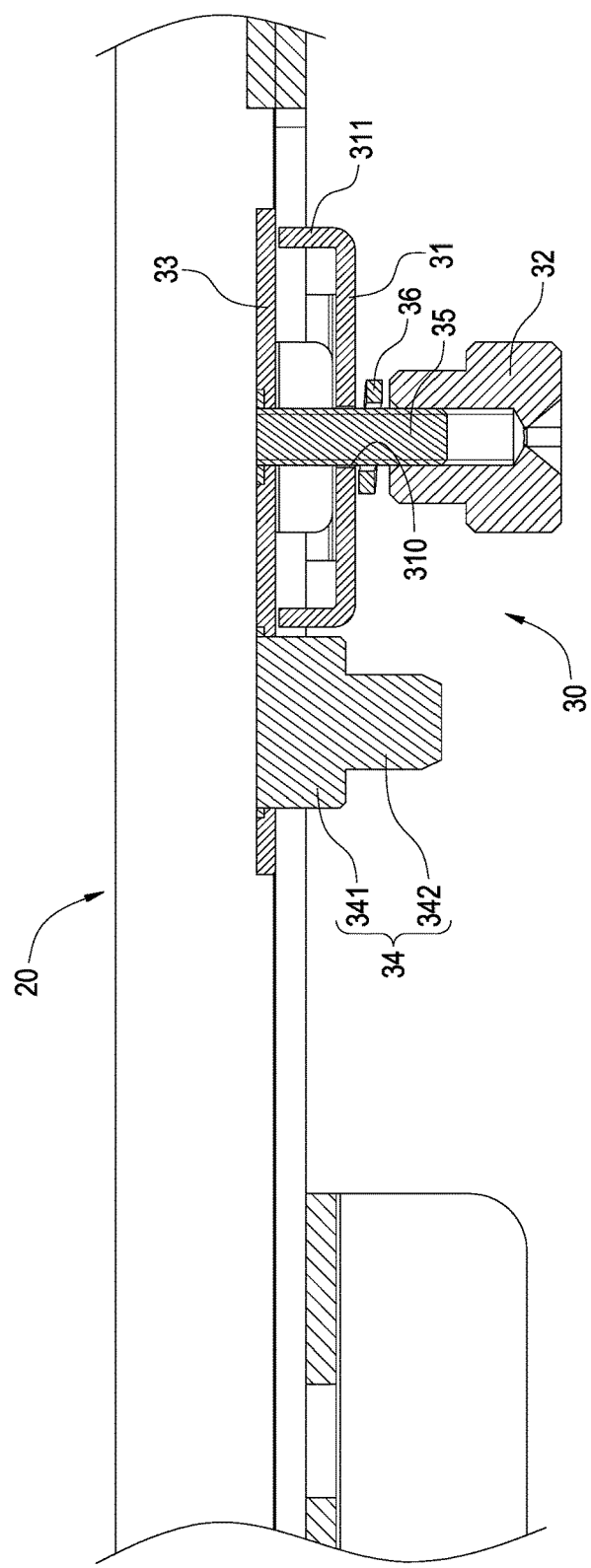
FIG. 7 is another cross-sectional view of the assembly of the slide rails and the supporting components of the present invention.

As shown in FIG. 6 and FIG. 7, the stud 34 of the supporting plate 33 passes through the trough 200 from the second side 202 of the slide rail 20 and protrudes the first side 201. Furthermore, the screw bolt 35 passes through the trough 200 of the slide rail 20 and the through hole 310 of the positioning plate 31 to be fixed by the screw nut 32. Therefore, the supporting plate 33 and the positioning plate 31 are combined at an end of the slide rail 20 by the screw bolt 35 and the screw nut 32 locked with each other.

Figure 8:
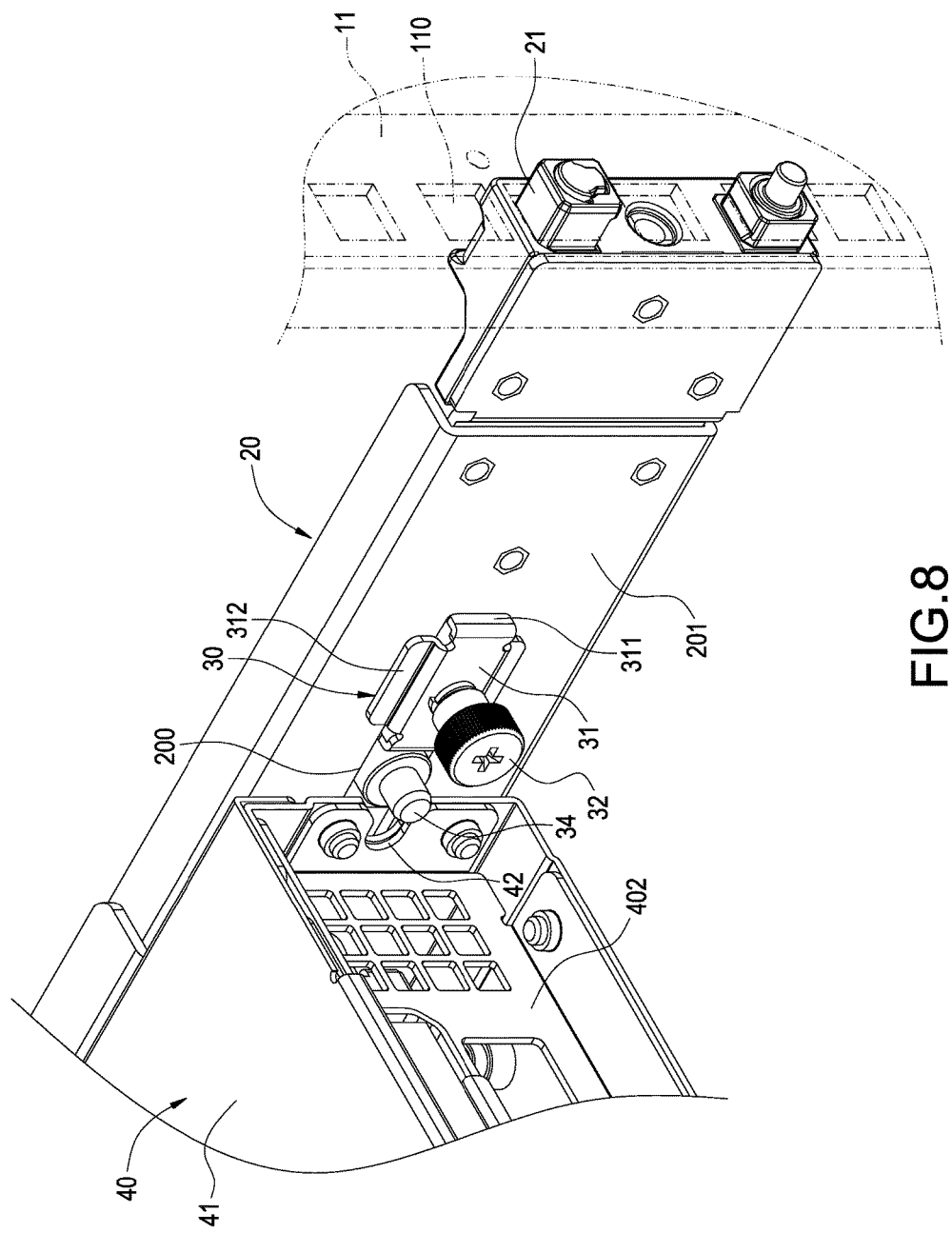
FIG. 8 is an assembly schematic view of the chassis and the slide rails of the present invention.
Figure 9:
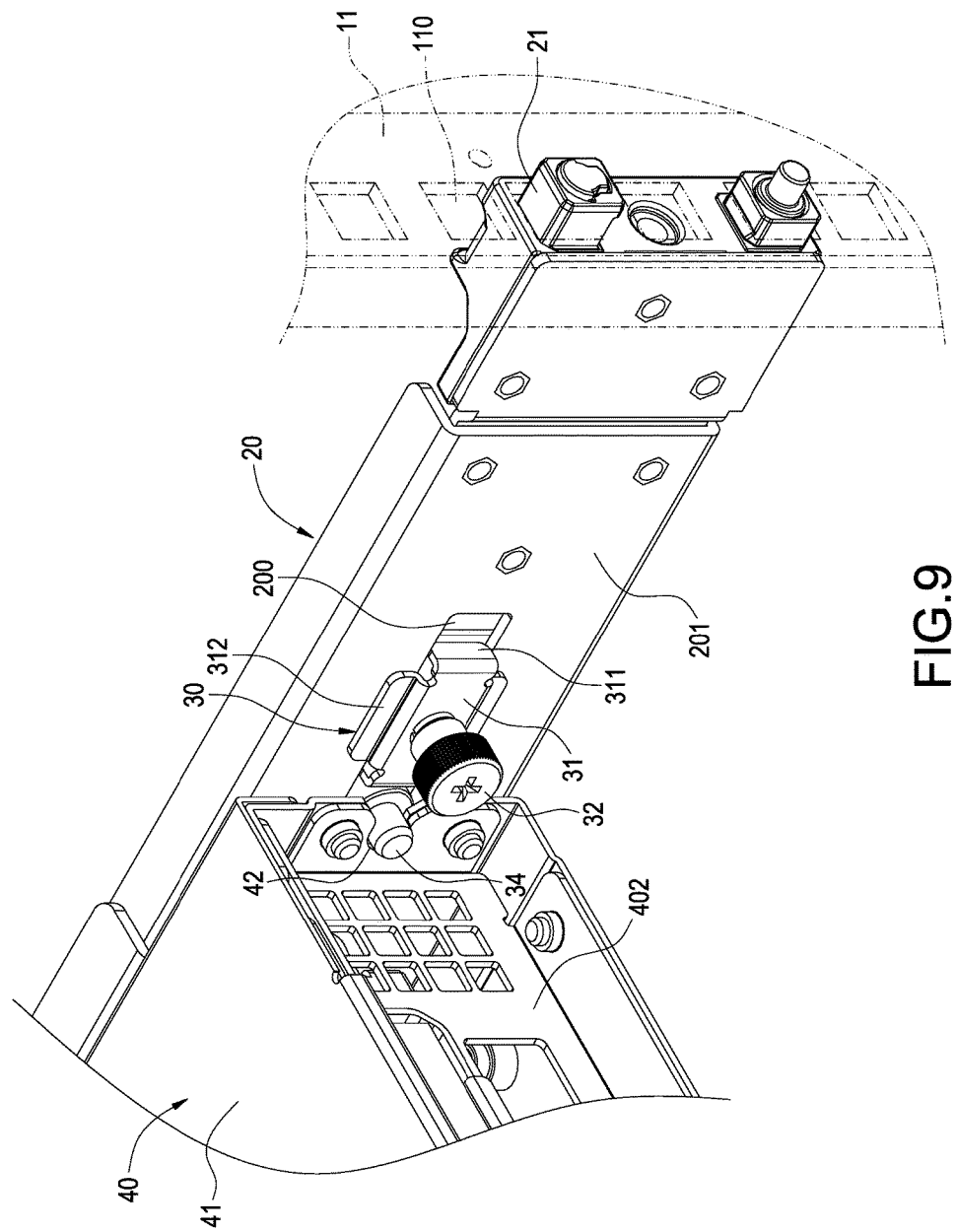
FIG. 9 is a schematic view of the chassis positioned on the supporting components of the present

With referring to FIG. 8 and FIG. 9, which depict a schematic view of the assembly of the chassis and the slide rails of the present invention and a schematic view of the chassis positioned on the supporting components of the present invention. Please refer to FIG. 8, in the present embodiment, the chassis 40 includes a shell 41 and a pair of notches 42 located on an end of the shell 41. In one embodiment of the present invention, the notch 42 is, but not limited to, formed directly on the shell 41. It is worth to notice that the positions of the supporting components 30 on the slide rails 20 are depended on the locations of the chassis 40 (the size of the shell 41) so as to adjust the positions in the trough 200.

Please further refer to FIG. 9, the end of the shell 41 is positioned between the pair of the slide rails 20 through the pair of the notches 42 and the stud 34 of the supporting components 30 buckled together. The rear end 402 of the chassis 40 provides support through the deposition of the supporting components 30. Thereby, the front end 401 and the rear end 402 of the chassis 40 will be supported and positioned separately, and thus the chassis 40 can be stably combined in the cabinet 10 without moving.

Figure 10:
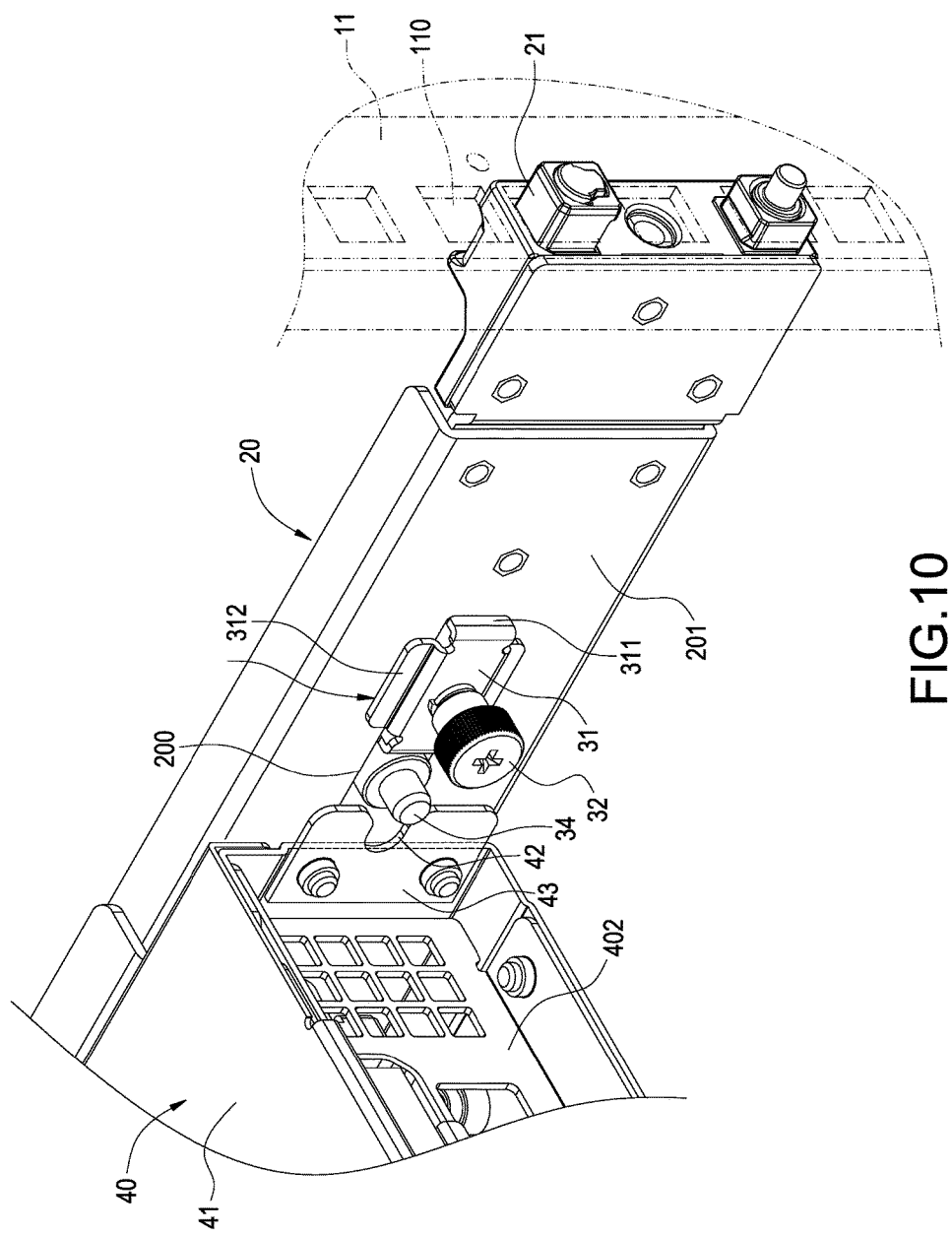
FIG. 10 is a schematic view of another embodiment of the chassis positioned on the supporting components of the present invention.

Please further refer to FIG. 10, which depicts a schematic view of another embodiment of the chassis positioned on the supporting components. In the present embodiment, the chassis 40 further includes a positioning tablet 43 combined at an end of the shell 41, and the notch 42 is located on the positioning tablet 43. Thereby, if an end of the shell 41 does not have a notch 42, the positioning tablet 43 can be locked at the end of the shell 41 by means of a plurality of fastening elements 44. In addition, the end of the shell 41 can be positioned between the slide rails 20 through the pair of the notches 42 and the stud 34 buckled together according to the way mentioned above.

Although the present invention has been described with reference to the preferred embodiment thereof, it will be understood that the invention is not limited to the details thereof. Various substitutions and improvements have been suggested in the foregoing description, and others will occur to those of ordinary skill in the art. Therefore, all such substitutions and improvements are intended to be embraced within the scope of the invention as defined in the appended claims.

What is claimed is:

1. An apparatus, comprising:
a cabinet having an accommodating space, and a plurality of frames provided in the accommodating space and disposed at interval;
a pair of slide rails configured on the frames correspondingly; each slide rail having a first side facing the other slide rail and a second side being opposite to the first side, and each slide rail having a trough at an end thereof;
a pair of supporting components disposed corresponding to the pair of slide rails and assembled on ends of the pair of slide rails separately; each of the supporting components comprising a positioning plate, a screw nut, a supporting plate, a stud and a screw bolt disposed on the supporting plate; the positioning plate having a through hole and being placed on the first side of the slide rail, and the supporting plate being plated on the second side of the slide rail; the stud passing through the trough from the second side of the slide rail and protruding the first side; the screw bolt passing through the trough and the through hole to be fixed by the screw nut; and
a chassis including a shell and a pair of notches located on an end of the shell, and the end of the shell being positioned between the pair of the slide rails through the pair of the notches and the stud buckled together.

2. The apparatus according to claim 1, wherein the frames are provided with a plurality of positioning holes separately, and a plurality of positioning blocks are disposed at an end of each slide rail; the pair of slide rails are combined with the frames through the positioning blocks inserted in the positioning holes.

3. The apparatus according to claim 1, wherein two opposite sides of the positioning plate are bent and extended with a pair of longitudinal constraint walls, and the pair of longitudinal constraint walls are inserted in the trough of the slide rail.

4. The apparatus according to claim 3, wherein a height of the pair of the longitudinal constraint walls is equal to a width of the trough, and two sides of the positioning plate abut against an inner wall of trough without rotating or moving.

5. The apparatus according to claim 3, wherein the other two opposite sides of the positioning plate are bent and extended with a pair of wings, and the pair of wings are located at two sides of the trough and contacted with the second side of the slide rail.

6. The apparatus according to claim 1, wherein two opposite sides of the supporting plate have a pair of slots and a pair of horizontal constraint walls located in the pair of slots, and the pair of horizontal constraint walls are inserted in the trough of the slide rail.

7. The apparatus according to claim 6, wherein a distance between the pair of horizontal constraint walls is equal to a width of the trough; and two sides of the supporting plate abut against an inner wall of trough without rotating or moving.

8. The apparatus according to claim 1, wherein the stud comprises a round seat riveted on the supporting plate and a short column extended from the round seat, and a diameter of the round seat is equal to a width of the trough so as to pierce in the trough.

9. The apparatus according to claim 1, wherein each supporting component further includes an elastic washer, and the elastic washer is clamped between the screw nut and the positioning plate.

10. The apparatus according to claim 1, wherein the notch is formed directly on the shell.

11. The apparatus according to claim 1, wherein the chassis further includes a positioning tablet combined at an end of the shell, and the notch is located on the positioning tablet.

* * * * *